(12) United States Patent
Takagi

(10) Patent No.: US 11,128,084 B2
(45) Date of Patent: Sep. 21, 2021

(54) JOINT CONNECTOR WITH A HEAT DISSPATION PLATE MOUNTED TO THE OUTER SURFACE OF THE HOUSING

(71) Applicant: Sumitomo Wiring Systems, Ltd., Mie (JP)

(72) Inventor: Kohei Takagi, Yokkaichi (JP)

(73) Assignee: Sumitomo Wiring Systems, Ltd.

( * ) Notice: Subject to any disclaimer, the term of this patent is extended or adjusted under 35 U.S.C. 154(b) by 20 days.

(21) Appl. No.: 16/821,963

(22) Filed: Mar. 17, 2020

(65) Prior Publication Data
US 2020/0303869 A1 Sep. 24, 2020

(30) Foreign Application Priority Data
Mar. 20, 2019 (JP) .............................. JP2019-052637

(51) Int. Cl.
*H01R 13/518* (2006.01)
*H05K 7/20* (2006.01)

(52) U.S. Cl.
CPC ....... *H01R 13/518* (2013.01); *H05K 7/20418* (2013.01)

(58) Field of Classification Search
CPC .... H01R 13/518; H01R 31/08; H01R 13/502; H01R 12/716; H05K 7/20; H05K 7/20154; H05K 1/0203; H05K 7/20418

USPC .................................................. 439/487, 485
See application file for complete search history.

(56) References Cited

U.S. PATENT DOCUMENTS

| | | | | |
|---|---|---|---|---|
| 5,073,127 A * | 12/1991 | Daly | .................... | H01R 12/772 439/473 |
| 5,645,455 A * | 7/1997 | Seki | ...................... | H01R 13/405 439/189 |
| 6,878,017 B2 * | 4/2005 | Sakurai | .................. | H01R 31/06 439/723 |
| 8,690,607 B2 * | 4/2014 | Tsukamoto | ........ | H01R 13/7193 439/620.09 |
| 9,692,185 B2 * | 6/2017 | Yamaguchi | .......... | H01R 13/684 |
| 2007/0202753 A1 | 8/2007 | Murakami et al. | | |
| 2008/0200075 A1 | 8/2008 | Murakami et al. | | |
| 2009/0098778 A1 | 4/2009 | Murakami et al. | | |

FOREIGN PATENT DOCUMENTS

JP      2004-111279      4/2004

* cited by examiner

*Primary Examiner* — Travis S Chambers
(74) *Attorney, Agent, or Firm* — Gerald E. Hespos; Michael J. Porco; Matthew T. Hespos

(57) ABSTRACT

It is aimed to improve heat dissipation. A joint connector (10) includes busbar terminals (12), a housing (14) and heat dissipation plates (16). The housing (14) includes at least two fittings (30) and a holding portion (32) defining the two fitting portions (30) and holding the busbar terminals (12). The heat dissipation plates (16) are mounted to contact outer surfaces close to the holding portion (32).

6 Claims, 5 Drawing Sheets

JOINT CONNECTOR WITH A HEAT DISSPATION PLATE MOUNTED TO THE OUTER SURFACE OF THE HOUSING

BACKGROUND

Field of the Invention

This disclosure relates to a joint connector.

Related Art

Japanese Unexamined Patent Publication No. 2004-111279 discloses a joint connector with a male connector including male terminals and a female connector including female terminals to be fit to the male terminals. The male terminals are at predetermined intervals in one direction and a direction intersecting the one direction on a printed circuit board. The male terminals are connected selectively by a copper foil circuit on the printed circuit board.

Heat generated at terminal contact points when energizing this joint connector is transferred to the circuit board via the male terminals and is dissipated to outside from the circuit board. However, heat easily accumulates in a housing and heat dissipation is reduced, for example, if busbar terminals are press-fit and held in a separation wall in the housing.

SUMMARY

This disclosure is directed to a joint connector with busbar terminals, a housing and a heat dissipation plate. The housing includes a holding portion with at least two fitting portions that hold the busbar terminals, and the heat dissipation plate is mounted to contact an outer surface of the housing close to the holding portion.

Heat generated in the busbar terminal when the busbar terminal is energized is transferred first to the holding portion of the housing holding the busbar terminal and subsequently to the outer surface of the housing close to the holding portion of the housing. Accordingly, the heat generated in the busbar terminal easily is transferred to the heat dissipation plate by mounting the heat dissipation plate to contact the outer surface close to the holding portion. In this way, heat dissipation can be improved.

The heat dissipation plate may include a side surface corresponding portion corresponding to the holding portion. Heat from the holding portion easily is transferred to the side surfaces of the housing, and the side surfaces tend to get hot. However, heat dissipation is improved by mounting the side surface corresponding portion of the heat dissipation plate to contact the side surface.

The side surface corresponding portion of the heat dissipation plate may cover the entire side surface. Thus, an area of the heat dissipation plate is large as compared to a configuration in which the heat dissipation plate covers a part of the side surface corresponding to the holding portion. Thus, heat dissipation can be improved.

A groove may be provided in one surface adjacent to the side surfaces. The groove may have a bottom surface close to the holding portion in the one surface, and the heat dissipation plate includes a bottom surface corresponding portion corresponding to the bottom surface of the groove. Thus, the heat generated in the busbar terminal is easily transferred to the bottom surface of the groove. Accordingly, the heat transferred to the bottom surface of the groove is transferred to the entire heat dissipation plate via the bottom surface corresponding portion by disposing the bottom surface corresponding portion to contact the bottom surface of the groove. Thus, heat dissipation is improved further.

According to this disclosure, heat dissipation can be improved.

DETAILED DESCRIPTION

A specific example of a joint connector 10 of this disclosure is described below with reference to the drawings. Note that the present disclosure is not limited to these illustrations and is intended to be represented by claims and include all changes in the scope of claims and in the meaning and scope of equivalents.

Figure 1:
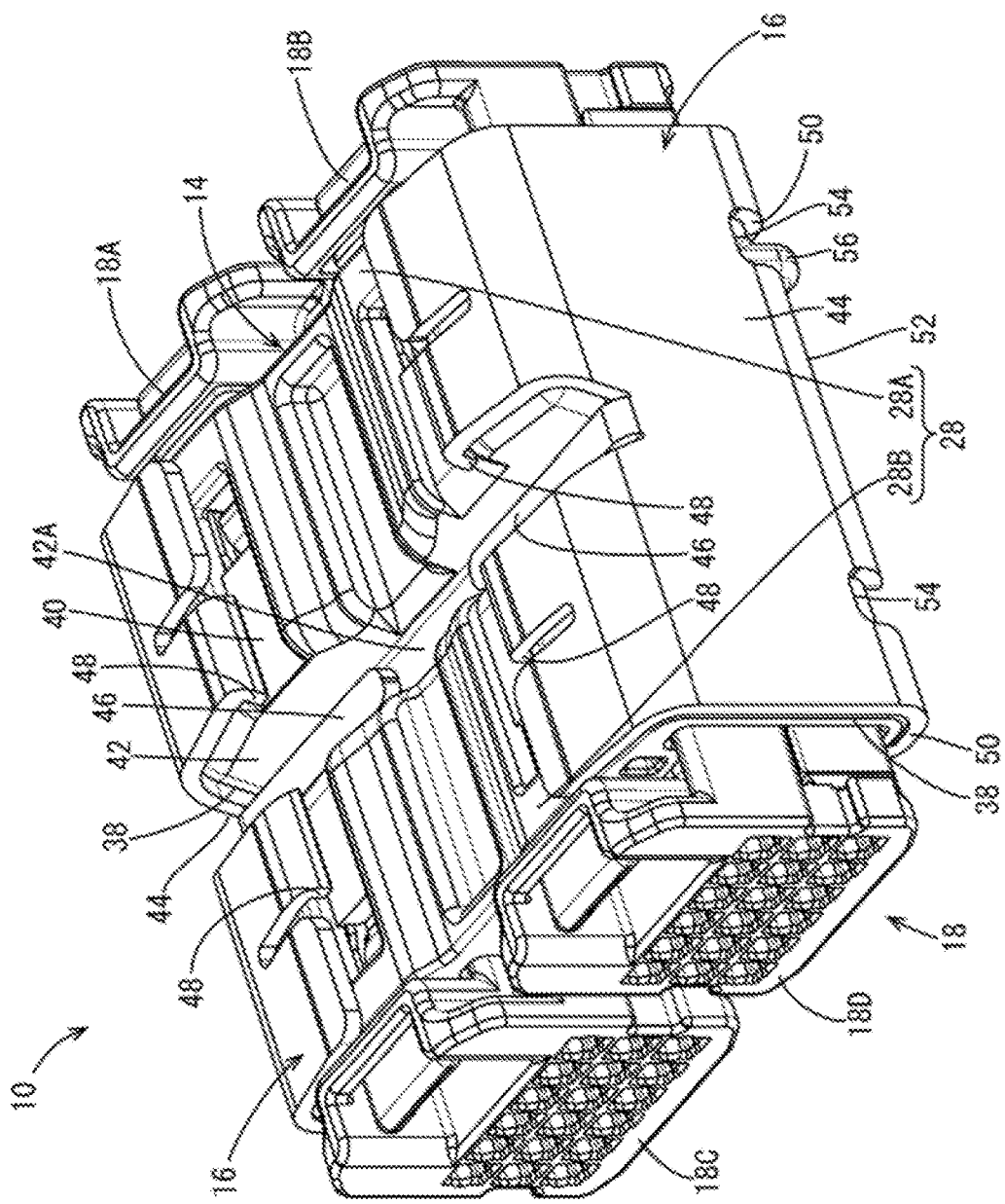
FIG. 1 is a perspective view of a joint connector according to an embodiment.
Figure 2:
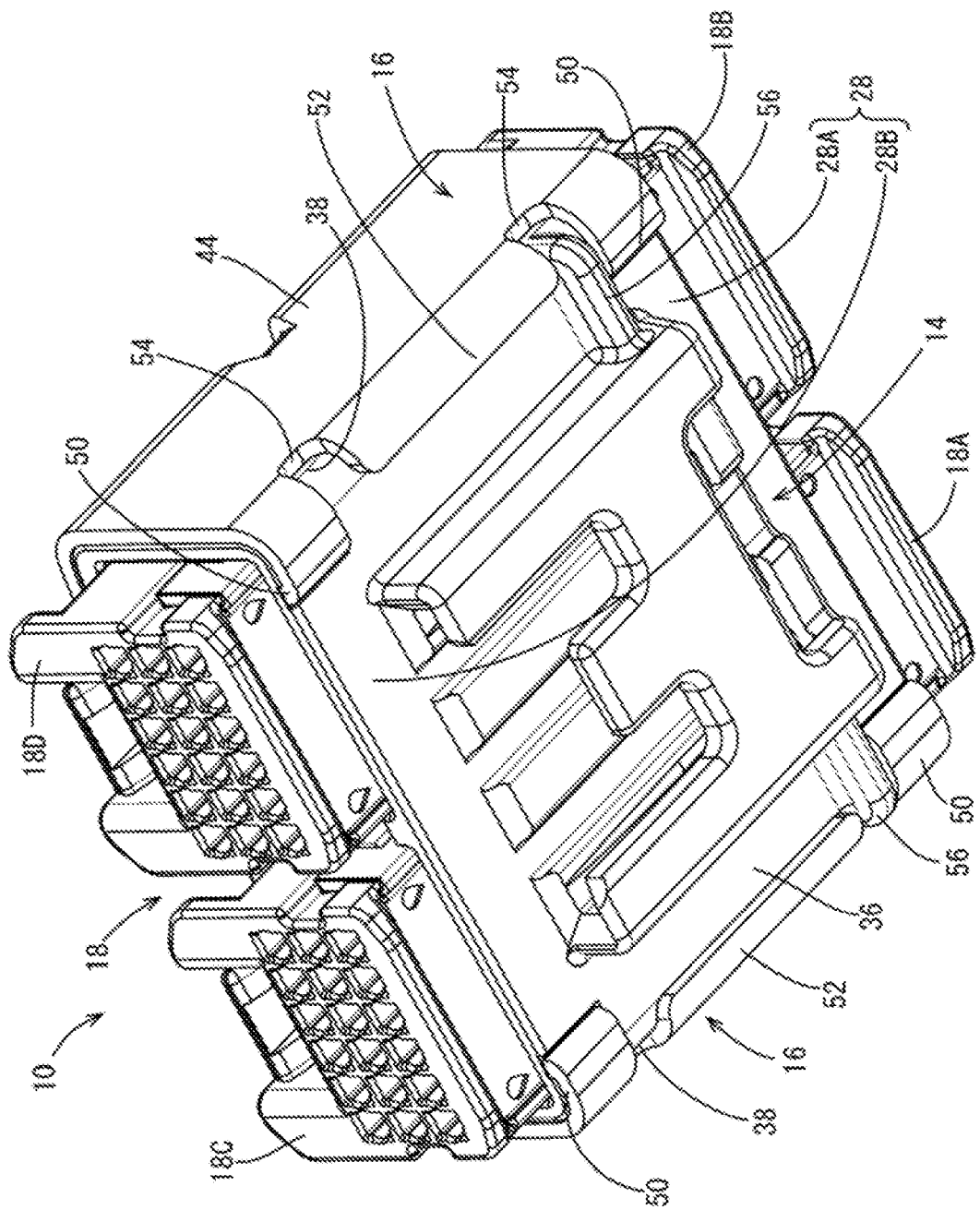
FIG. 2 is a perspective view of the joint connector viewed from below.
Figure 3:
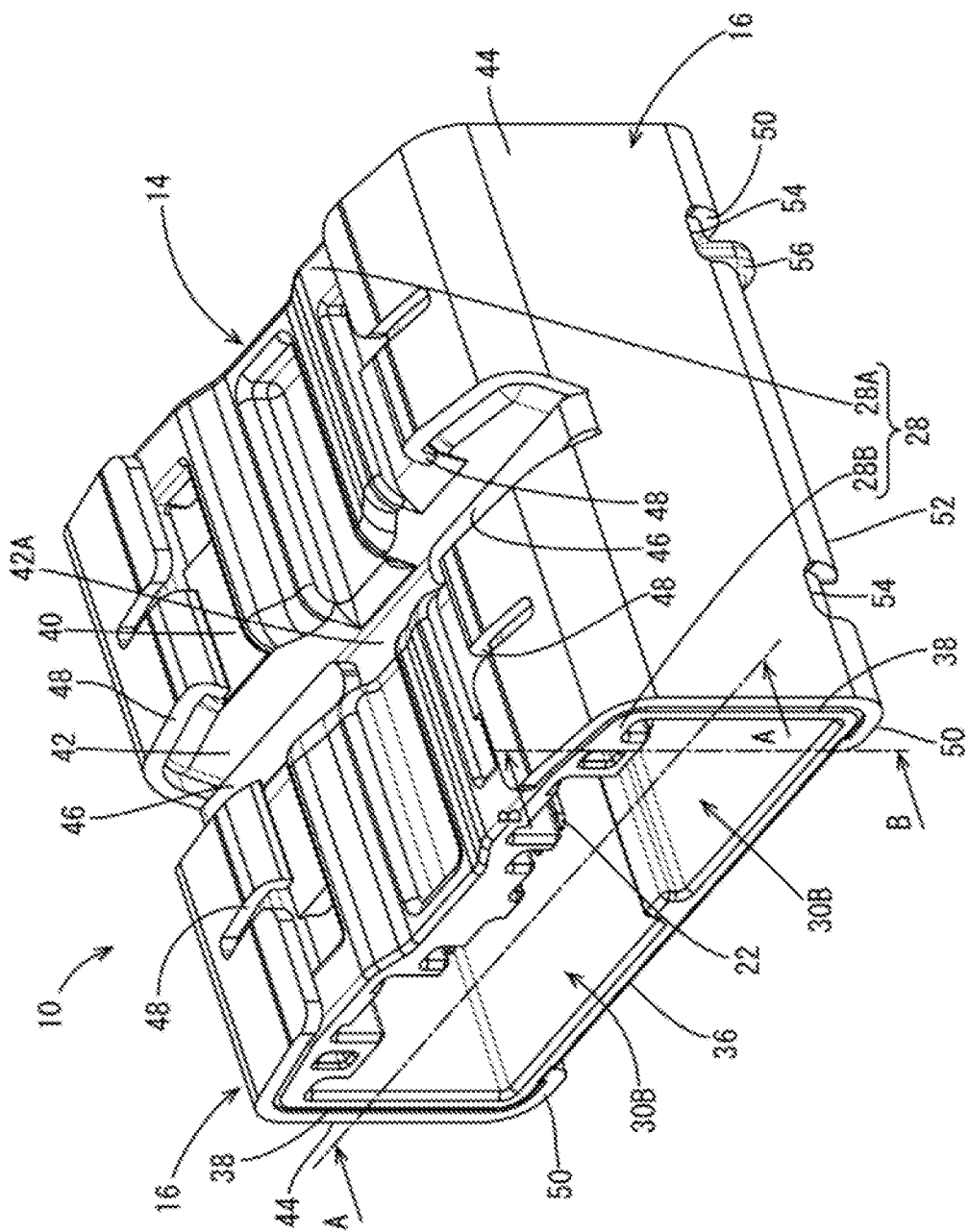
FIG. 3 is a perspective view of the joint connector when a mating connector is removed.
Figure 4:
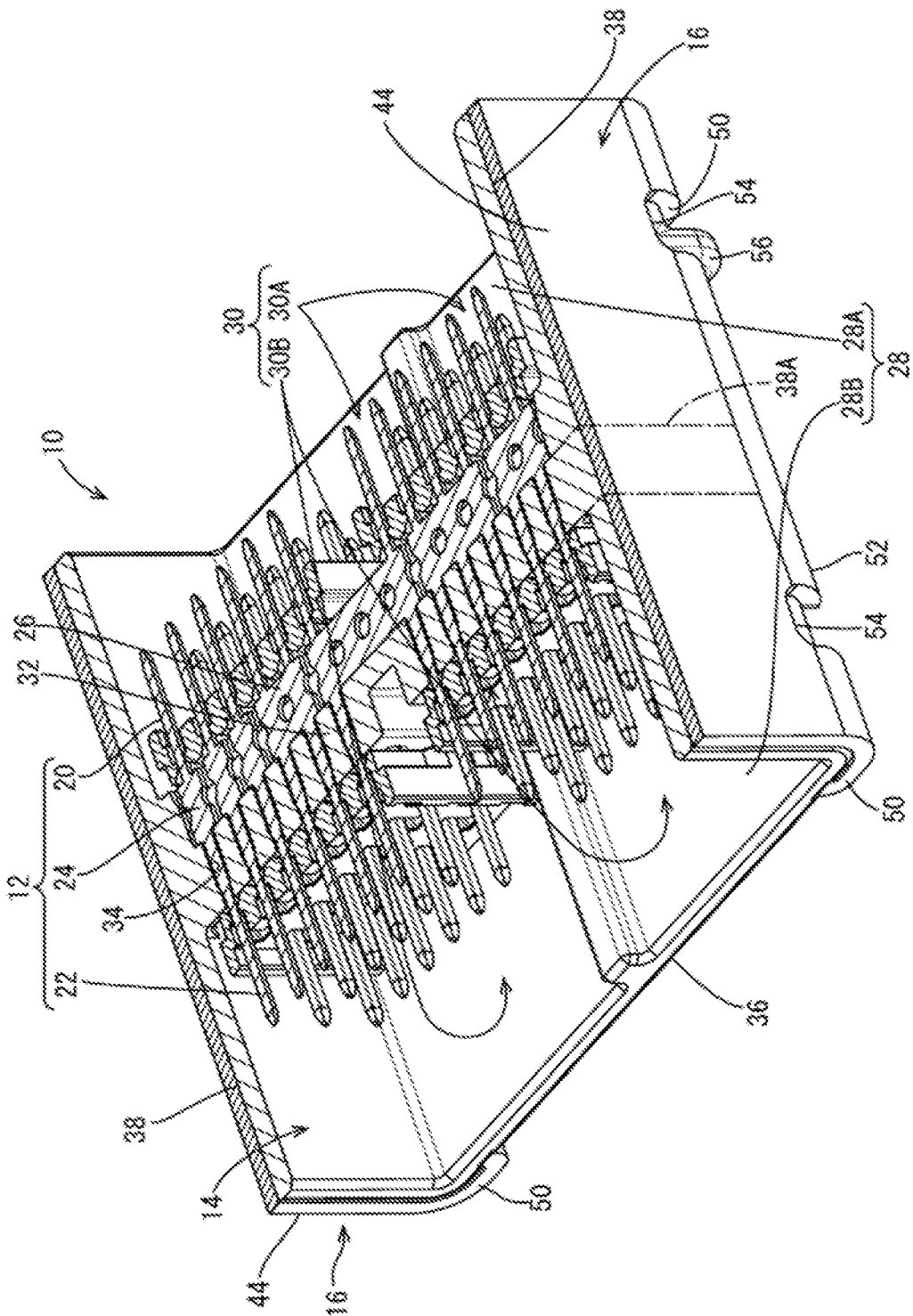
FIG. 4 is a perspective view partly in section along A-A in FIG. 3.
Figure 5:
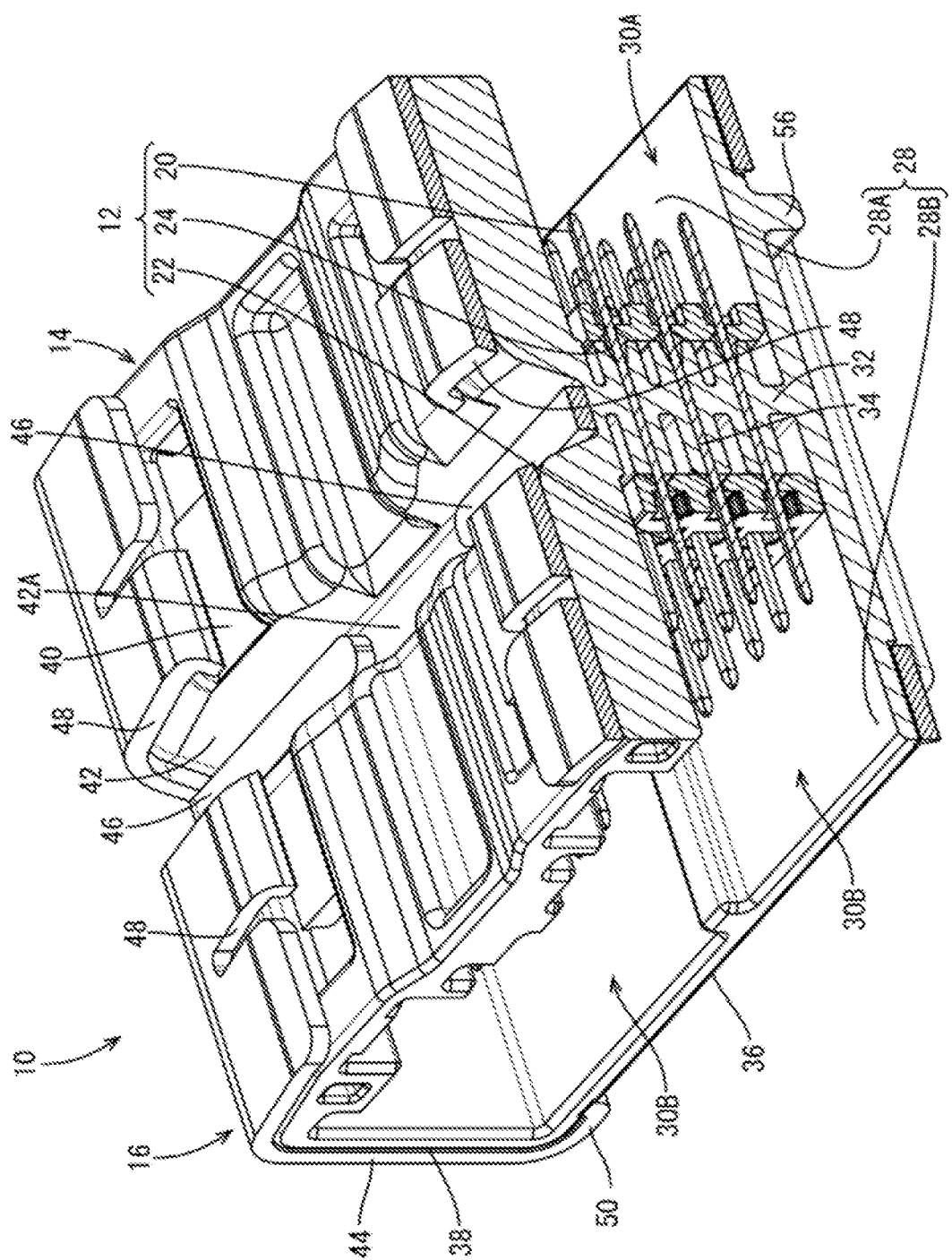
FIG. 5 is a perspective view partly in section along B-B in FIG. 3.

As shown in FIGS. 4 and 5, the joint connector 10 of this embodiment includes busbar terminals 12, a housing 14 and heat dissipation plates 16. As shown in FIGS. 1 and 2, four mating connectors 18 (mating connectors 18A, 18B, 18C and 18D) are connected to the joint connector 10. In the following description, a front-rear direction is based on a connecting direction of the housing 14 and the mating connectors 18. Further, a direction from a side surface 38 on a back side toward a side surface 38 on a front side in FIG. 3 is a rightward direction along a lateral direction. Further, a direction from a lower side toward an upper side in FIG. 3 is an upward direction along a vertical direction.

As shown in FIG. 4, the busbar terminal 12 includes a first connecting portion 20 extending forward, a second connecting portion 22 extending rearward and a relay portion 24 connected to the first and second connecting portions 20, 22. Busbar terminals 12 are provided in the housing 14, and laterally adjacent busbar terminals 12 are connected selectively by couplings 26.

As shown in FIG. 4, the housing 14 includes receptacles 28, fittings 30 and a holding portion 32. The receptacles 28 include a forwardly open first receptacle 28A and a rearwardly open second receptacle 28B.

As shown in FIG. 4, the fittings 30 include first fittings 30A and second fittings 30B. The first fittings 30A include left and right first fittings 30A inside the first receptacle 28A, and the mating connectors 18A, 18B (shown in FIGS. 1 and 2) are fit respectively into the first fittings 30A. The second fittings 30B include left and right second fittings 30B inside the second receptacle 28B, and the mating connectors 18C, 18D (shown in FIGS. 1 and 2) are fit respectively into the respective second fittings 30B.

As shown in FIGS. 4 and 5, the holding portion 32 is provided between the first and second receptacles 28A, 28B. The holding portion 32 defines the first and second fittings 30A, 30B and holds the busbar terminals 12. Press-fit holes 34 penetrate through the holding portion 32 from a front surface to a rear surface at predetermined intervals in the vertical and lateral directions. The second connecting portion 22 of the busbar terminal 12 is press-fit through an opening of the press-fit hole 34 on the side of the first receptacle 28A. A press-fitting operation of the busbar terminal 12 is stopped by an edge of the relay portion 24 in the busbar terminal 12 contacting an opening edge of the press-fit hole 34. The busbar terminal 12 that has been press-fit into the press-fit hole 34 is held in the holding portion 32.

As shown in FIGS. 3 and 5, an outer surface of the housing 14 adjacent to the side surfaces 38 is referred to as an upper surface 40, and the surface located on a side opposite to the upper surface 40 is referred to as a lower surface 36. The upper surface 40 is provided with a groove 42 formed by thinning a part of the housing 14. The groove 42 generally is provided to suppress sinks produced when the housing 14 is molded and is long in the lateral direction. As shown in FIG. 5, the groove 42 is at a position corresponding to the holding portion 32 in the upper surface 40 of the housing 14. In this way, a bottom surface 42A of the groove 42 is at a position close to the holding portion 32.

The heat dissipation plates 16 are formed by press-working and bending a metal plate made of a material having a high thermal conductivity (e.g. copper alloy) and are separate from the housing 14. As shown in FIG. 3, left and right heat dissipation plates 16 are provided and are mounted on the housing 14 in the lateral direction. Each heat dissipation plate 16 includes a side surface corresponding portion 44, a bottom surface corresponding portion 46, upper hooks 48 and lower hooks 50.

As shown in FIGS. 3 and 4, the side surface corresponding portion 44 covers the entire side surface 38 of the housing 14 while being held in contact with the side surface 38. Thus, as shown in FIG. 4, the side surface corresponding portion 44 covers a side surface 38A corresponding to the holding portion 32.

As shown in FIG. 3, the bottom surface corresponding portion 46 projects toward the facing other heat dissipation plate 16 from the upper end of the side surface corresponding portion 44. As shown in FIG. 5, the bottom surface corresponding portion 46 is in contact with the bottom surface 42A of the groove 42 in the housing 14.

As shown in FIG. 3, front and rear upper hooks 48 project toward the facing other heat dissipation plate 16 from the upper end of the side surface corresponding portion 44. Further, a tip of each upper hook 48 projects down to define a hook shape. The front and rear upper hooks 48 are forward and rearward of the bottom surface corresponding portion 46 and are hooked and locked to the inner wall of a groove in the upper surface 40 of the housing 14.

As shown in FIG. 2, front and rear lower hooks 50 project toward the facing other heat dissipation plate 16 from the lower end of the side surface corresponding portion 44. Further, a tip part of the lower hook 50 projects up to define a hook shape. The lower hooks 50 are hooked and locked to the inner wall of a groove in the lower surface 36 of the housing 14.

The upper and lower hooks 48, 40 are locked to the housing 14 to prevent the heat dissipation plate 16 from being displaced in the lateral direction with respect to the housing 14.

As shown in FIG. 2, a projecting piece 52 is located between the two lower hooks 50 in the heat dissipation plate 16 and has a curved shape. In this way, the projecting piece 52 is in contact with a corner of the housing 14 between the side surface 36 and the lower surface 36. Recesses 54 are formed between the projecting piece 52 and lower hooks 50 of the heat dissipation plate 16.

As shown in FIG. 2, a projection 56 projects from the side surface 36 of the housing 14 to the corner part and is located inside one of the recesses 54. In this way, the heat dissipation plate 16 is restricted from being displaced in the front-rear direction with respect to the housing 14. Further, the other recess 54 is provided to make the pair of left and right heat dissipation plates 16 have the same shape. For example, if the heat dissipation plate 16 provided on the right side surface 38 of the housing 14 is mounted on the left side surface 38, the other recess 54 is fit to the projection 56 of the housing 14. In this way, the heat dissipation plate 16 can be mounted on either of the left and right side surfaces 38.

Unillustrated female terminals are accommodated in the mating connectors 18 (mating connectors 18A, 18B, 18C and 18D). When the mating connectors 18 are connected to the joint connector 10, the unillustrated female terminals are connected to the busbar terminals 12. Specifically, the unillustrated female terminals accommodated in the mating connectors 18A, 18B are connected to the first connecting portions 20 of the busbar terminals 12. Further, the unillustrated female terminals accommodated in the mating connectors 18C, 18D are connected to the second connecting portions 22 of the busbar terminals 12. In this way, the female terminals in the mating connectors 18 are connected selectively by the busbar terminals 12.

The energized busbar terminals 12 generate heat due to electrical resistance at contact points between the busbar terminals 12 and the unillustrated female terminals. The heat generated in the busbar terminals 12 is transferred to the holding portion 32 of the housing 14 holding the busbar terminals 12. Subsequently, the heat transferred to the holding portion 32 is transferred to outer surfaces close to the holding portion 32 (i.e. the side surfaces 38A and the bottom surface 42A).

As shown in FIG. 4, the side surfaces 38A of the housing 14 are close to the holding portion 32. Thus, the heat from the holding portion 32 easily is transferred to the side surfaces 38A and the side surfaces 38A tend to get hot. The heat transferred to the side surfaces 38A is transferred further to the side surface corresponding portions 44 of the heat dissipation plates 16. The heat transferred to the side surface corresponding portions 44 is diffused to the entire heat dissipation plates 16 and dissipated to outside. At this time, the side surface corresponding portions 44 cover the entire side surfaces 38 of the housing 14 including the side surfaces 38A. These areas of the heat dissipation plates 16 are large as compared to a configuration in which side surface corresponding portions cover only the side surfaces 38A. Thus, heat dissipation of the heat dissipation plates 16 is improved, and an increase of the electrical resistance associated with a temperature increase of the busbar terminals 12 is suppressed.

As shown in FIG. 5, the bottom surface 42A of the groove 42 in the housing 14 is close to the holding portion 32. Thus, heat generated in the busbar terminals 12 easily is transferred to the bottom surface 42A. The heat transferred to the bottom surface 42A is transferred to the bottom surface corresponding portions 46 of the heat dissipation plates 16 and is diffused to the entire heat dissipation plates 16 and to outside. Thus, the bottom surface corresponding portions 46 dissipate the heat transferred to the bottom surface 42A. Therefore, the heat dissipation of the heat dissipation plates 16 is improved.

If a current applied to the busbar terminals 12 is small, the heat generation of the busbar terminals 12 is small. Thus, the heat dissipation plates 16 are generally unnecessary. On the other hand, if a current applied to the busbar terminals 12 is large, the heat dissipation plates 16 are necessary. The heat dissipation plates 16 are separate from the housing 14 and can be mounted or removed selectively according to the magnitude of a current applied to the busbar terminals 12. If the heat dissipation plates 16 are removed, the joint connector can be reduced in weight by the weight of the heat dissipation plates 16 and can be made less expensive by the price of the heat dissipation plates 16. Further, the outermost shape of the joint connector is equal to that of the housing 14. Thus, a change in the outermost shape of the joint connector caused by providing the heat dissipation plates 16 need not be considered.

Other Embodiments

Left and right heat dissipation plates 16 are provided in the above embodiment, but there is no limitation to this. For example, only one of the left and right heat dissipation plates 16 may be provided.

The side surface corresponding portion 44 of the heat dissipation plate 16 covers the entire side surface 38 of the housing 14 in the above embodiment. However, a side surface corresponding portion may cover only a part corresponding to the holding portion.

The heat dissipation plate 16 has the side surface corresponding portion 44 and the bottom surface corresponding portion 46 in the above embodiment. However, only one of the side surface corresponding portion and the bottom surface corresponding portion may be provided.

The groove 42 is provided in the upper surface 40 of the housing 14 in the above embodiment. However, a groove may be provided in the lower surface of the housing.

What is claimed is:

1. A joint connector, comprising:
   a housing with opposite first and second ends, first and second receptacles extending respectively into the first and second ends, and a holding portion between the first and second receptacles, a groove extending across an outer peripheral surface of the housing, the groove having a bottom surface at a position aligned with the holding portion;
   a busbar terminal mounted in the holding portion; and
   a heat dissipation plate mounted to contact the outer surface of the housing and including a bottom surface corresponding portion disposed in the groove and contacting the bottom surface of the groove so that the bottom surface corresponding portion is close to the holding portion.

2. The joint connector of claim 1, wherein the heat dissipation plate includes first and second side surface corresponding portions respectively contacting each of first and second opposite side surfaces of the outer periphery of the housing and at least partly aligned with the holding portion.

3. The joint connector of claim 2, wherein the side surface corresponding portions of the heat dissipation plate covers all of each of the side surfaces of the housing.

4. The joint connector of claim 3, wherein:
   the bottom surface corresponding portion comprises first and second bottom surface corresponding portions bent respectively from the first and second side surface corresponding portions.

5. The joint connector of claim 2, wherein:
   the heat dissipation plate includes upper and lower hooks projecting respectively from upper and lower ends of the surface corresponding portions and hooked into engagement with upper and lower surfaces regions of the outer peripheral surface of the housing.

6. The joint connector of claim 5, wherein the lower surface regions of the outer peripheral surface of the housing comprise projecting pieces, the lower hooks of the heat dissipation plate engaging the projecting pieces to prevent shifting of the heat dissipation plate between the first and second ends of the housing.

\* \* \* \* \*